United States Patent
Magnus et al.

(10) Patent No.: US 8,685,790 B2
(45) Date of Patent: Apr. 1, 2014

(54) SEMICONDUCTOR DEVICE PACKAGE HAVING BACKSIDE CONTACT AND METHOD FOR MANUFACTURING

(75) Inventors: Alan J. Magnus, Gilbert, AZ (US); Carl E. D. Acosta, Mesa, AZ (US); Douglas G. Mitchell, Tempe, AZ (US); Justin E. Poarch, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/397,034

(22) Filed: Feb. 15, 2012

(65) Prior Publication Data

US 2013/0207255 A1    Aug. 15, 2013

(51) Int. Cl.
*H01L 21/00* (2006.01)

(52) U.S. Cl.
USPC .... 438/106; 438/109; 438/455; 257/E21.498; 257/E21.502

(58) Field of Classification Search
None
See application file for complete search history.

(56) References Cited

U.S. PATENT DOCUMENTS

| 5,353,498 | A | 10/1994 | Fillion et al. | |
|---|---|---|---|---|
| 6,570,247 | B1 | 5/2003 | Eiles et al. | |
| 7,011,988 | B2 | 3/2006 | Forcier | |
| 7,033,866 | B2 | 4/2006 | Chow et al. | |
| 7,892,882 | B2 | 2/2011 | Leal et al. | |
| 2007/0212865 | A1 | 9/2007 | Amrine et al. | |
| 2007/0284704 | A1* | 12/2007 | Leal et al. | 257/666 |
| 2009/0176348 | A1* | 7/2009 | Griffiths | 438/458 |
| 2010/0029045 | A1 | 2/2010 | Ramanathan et al. | |
| 2011/0001250 | A1* | 1/2011 | Lin et al. | 257/778 |
| 2012/0074580 | A1* | 3/2012 | Nalla et al. | 257/774 |

FOREIGN PATENT DOCUMENTS

WO    2007120959 A2    10/2007

* cited by examiner

*Primary Examiner* — Julio J Maldonado
*Assistant Examiner* — Joseph Galvin, III
(74) *Attorney, Agent, or Firm* — Jonathan N. Geld

(57) ABSTRACT

A method and apparatus for forming a backside contact, electrical and/or thermal, for die encapsulated in a semiconductor device package are provided. Die of varying thicknesses can be accommodated within the semiconductor device package. Embodiments of the present invention provide a conductive pedestal coupled to a backside contact of a die, where the coupling is performed prior to encapsulating the die within the package. In addition, conductive pedestals coupled to varying die within a semiconductor device package are of such a thickness that each conductive pedestal can be exposed on the back side of the package without exposing or damaging the backside of any encapsulated die. Embodiments of the present invention provide for the conductive pedestals being made of electrically or thermally conductive material and coupled to the device die contact using an electrically and/or thermally conductive adhesive.

12 Claims, 4 Drawing Sheets

SEMICONDUCTOR DEVICE PACKAGE HAVING BACKSIDE CONTACT AND METHOD FOR MANUFACTURING

BACKGROUND

1. Field

This disclosure relates generally to semiconductor device packaging, and more specifically, to providing a backside electrical and/or thermal contact for die encapsulated in the semiconductor device package.

2. Related Art

The trend toward more compact electrical devices has driven the need for smaller semiconductor packaging techniques, such that the package itself is commonly on the order of the size of semiconductor die embedded within the package. As density of such components increases, the need for advanced heat transfer techniques becomes increasingly significant. This is particularly the case with respect to power amplifier devices and other such high-power semiconductor die. In addition, in designs where devices such as diodes, silicon controlled rectifiers, thyristors, or FETs are embedded within the package, electrical contact to both sides of the device die is often necessary.

Existing methods for enhancing thermal transfer from embedded die involve providing a heat spreader or heat sink that is significantly larger than the heat producing die itself. Such large form factor heat transfer devices are contrary to the goal of high density small semiconductor packages, as they require accommodation within the package.

In addition, while certain die have electrical contacts on both sides of the die, packaging techniques such as redistributed chip packaging (RCP) cannot accommodate die of varying thicknesses without either potentially damaging the device die, or involving significant additional processing steps.

It is therefore desired to have a mechanism for producing a semiconductor device package that enables backside contact for multiple die of varying thicknesses when using device packaging techniques such as RCP.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Figure 1:
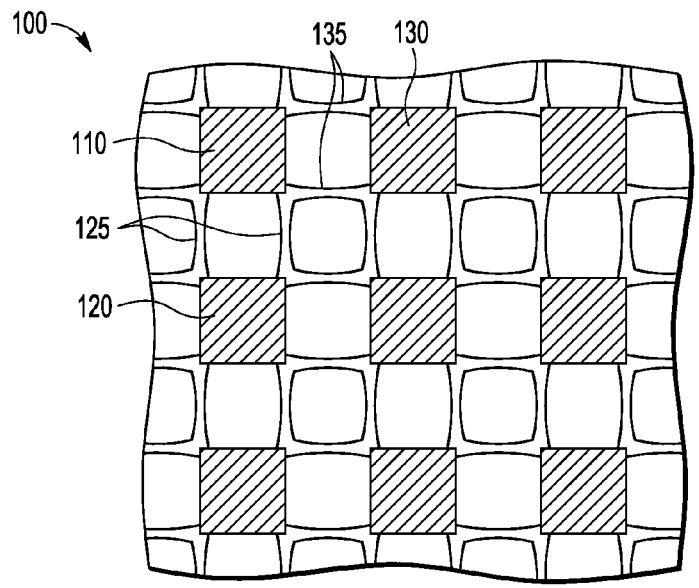
FIG. 1 is a simplified block diagram illustrating one example of a lead frame array of conductive pedestals usable with embodiments of the present invention.

A method and apparatus for forming a backside contact, electrical and/or thermal, for die encapsulated in a semiconductor device package are provided. The method and apparatus can accommodate die of varying thicknesses within the semiconductor device package. Embodiments of the present invention provide a conductive pedestal coupled to a backside contact of a die, where the coupling is performed prior to encapsulating the die within the package. In addition, conductive pedestals coupled to varying die within a semiconductor device package are of such a thickness that each conductive pedestal can be exposed on the back side of the package without exposing or damaging the backside of any encapsulated die. Embodiments of the present invention provide for the conductive pedestals being made of electrically or thermally conductive material and coupled to the device die contact using an electrically and/or thermally conductive adhesive.

Certain electronic devices that are desirable in semiconductor device packages provide electrical contacts or thermal contacts or both on two major surfaces of the device die. Conventional chip-scale packaging techniques do not provide a practical mechanism for accessing the die back side contacts when space is at a premium. For example, certain device packages that provide for thermal contacts utilize heat spreading devices that consume significantly more package floor plan area than the device die itself. This has an effect of decreasing device density within a semiconductor device package at a time when demands are trending toward increased density. Other solutions to gain access to the die back side contacts include, for example, provide for laser ablation steps to remove package encapsulant from regions covering die back sides in order to gain access to thermal or electrical contacts. Subsequently, conductive material is formed within the ablated regions (e.g., vias) to provide package contacts to the device contacts. These solutions typically require multiple additional processing steps that are resource and time intensive, and which also may inherently have accuracy problems.

In order to address the size and additional processing step issues, while providing effective thermal and electrical access to device die backside contacts, embodiments of the present invention provide for attaching a conductive pedestal to the device die backside contacts prior to encapsulation. In order to address the package device density concerns, embodiments of the present invention provide for the conductive pedestal having a cross sectional area that is less than the floor plan area of the device die to which the conductive pedestal is attached. In order to address concerns regarding additional processing steps, embodiments of the present invention provide for the conductive pedestal being exposed through a backside grind or polishing process of the semiconductor device package. This has a further advantage in that conductive pedestals can be attached to device die of varying thicknesses, and then the conductive pedestals attached to each of those die can be exposed by removing sufficient encapsulant and pedestal material to expose a surface of the lowest of the conductive pedestals.

Once the conductive pedestals have been exposed, further package processing can be performed to couple the exposed conductive pedestals to desired features (e.g., electrical contacts, heat sinks, package backside interconnect, package-on-package configurations, and the like).

FIG. 1 is a simplified block diagram illustrating one example of a lead frame array 100 including conductive pedestals usable with embodiments of the present invention. Conductive pedestals 110, 120, and 130 are coupled to one another by spar features 125 (coupling conductive pedestal 110 to 120) and 135 (coupling conductive pedestal 110 to 130). As illustrated, the lead frame design includes the conductive pedestal, no leads, and minimal spar features tying the conductive pedestals to one another. The conductive pedestals can be formed of any material suitable for conducting, or superconducting, heat and/or electricity (e.g., copper, nickel, gold, aluminum, ceramics, metal alloys, and the like). Choice of material used for a conductive pedestal is determined by the application (e.g., heat conductance to a heat sink, an electrical connection, or electrical shielding).

Lead frame array 100 is manufactured to a predetermined conductive pedestal size and layout. In order to conserve space within the semiconductor device package, the area of a major side of the conductive pedestals should be smaller than that of a major surface of a die to which the conductive pedestal will be attached. In the event of several die used for an application that have varying areas, the conductive pedestal major surface should have an area smaller than that of the smallest die area, while still being suitable for the application. Using conductive pedestals having smaller area has an added advantage of placing burrs produced during singulation of the lead frame array within the area outline of a die attached to the conductive pedestal (see, e.g., FIG. 3).

Figure 2:
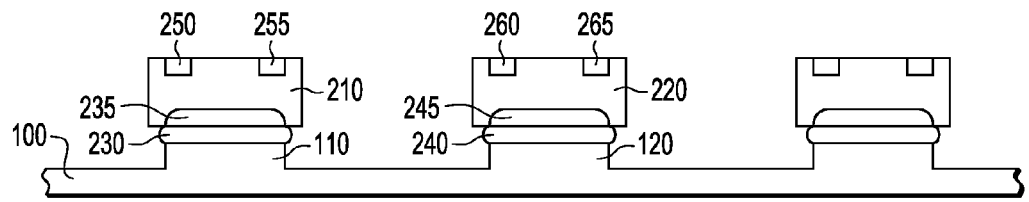
FIG. 2 is a simplified block diagram illustrating a cross section of an example of die attached to a lead frame array, in accord with embodiments of the present invention.

FIG. 2 is a simplified block diagram illustrating a cross section of an example of die attached to a lead frame array such as that illustrated in FIG. 1. A portion of lead frame array 100 is illustrated with conductive pedestal 110 and conductive pedestal 120 coupled by spar 125. Spar 125 has a thickness that is less than that of conductive pedestals 110 and 120. This can be provided by manufacturing lead frame array 100 using, for example, a half etch process in which the spars are reduced in thickness as compared to the conductive pedestals.

Die 210 and 220 are coupled to conductive pedestals 110 and 120, respectively, using a conductive adhesive 230 and 240. Conductive adhesive 230 and 240 can be any material or combinations of materials capable of bonding semiconductor die to a conductive pedestal, and capable of conducting heat away from the die and/or providing an electrical path. Examples of such conductive adhesive materials include solder material, conductive epoxies, and conductive die attach tape. As will be discussed in greater detail below, the conductive adhesive materials should also be able to maintain adhesion under any shear stresses experienced at the connection as generated during the process of removal of encapsulant from the semiconductor device package backside. Conductive adhesive 230 and 240 provide a thermal and/or electrical contact between die backside contact 235 and conductive pedestal 110 and die backside contact 245 and conductive pedestal 120, respectively.

The assembly illustrated in FIG. 2 can be provided, for example, through the use of pick and place operations in which the conductive adhesive material is applied to conductive pedestals in the lead frame array and subsequently the die are placed on the conductive adhesive material opposite to the die active side. In the context of FIG. 2, active side of a die means that electrical contacts 250 and 255 for die 210 and electrical contacts 260 and 265 for die 220 are placed away from the conductive pedestals. Subsequent to placement, the conductive adhesive is cured by means appropriate for the conductive adhesive (e.g., heating).

Figure 3:
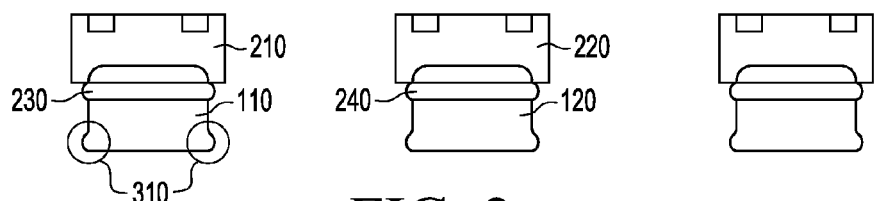
FIG. 3 is a simplified block diagram illustrating the assembly of FIG. 2 subsequent to singulation of the conductive pedestals, in accord with embodiments of the present invention.

FIG. 3 is a simplified block diagram illustrating the assembly of FIG. 2 subsequent to singulation of the conductive pedestals. As illustrated, spars 125 have been cut from conductive pedestals 110 and 120 using singulation techniques known in the art (e.g., sawing). The singulation process may result in burrs 310 remaining attached to, for example, conductive pedestal 110. One benefit of using a conductive pedestal having dimensions smaller than those of an attached die is that the burrs remain within the area provided by the attached die. The burrs then will not hinder picking and placing the die/conductive pedestal assembly by standard pick and place tools. Also, the structure of the lead frame array in which the spars are thinner than the conductive pedestals allows for sawing techniques during singulation that have the saw blade away from the die that are coupled to the conductive pedestals.

Figure 4:
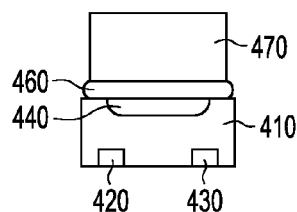
FIG. 4 is a simplified block diagram illustrating an alternative assembly of a conductive pedestal to a die.

FIG. 4 is a simplified block diagram illustrating an alternative assembly of a conductive pedestal to a die. In this embodiment, die 410 is placed active side down (i.e., with electrical contacts 420 and 430 face down) on an appropriate carrier or holder, while a thermal or electrical contact 440 on a major surface of the die opposite to the electrical contacts faces away from the carrier. A conductive adhesive 460, such as that discussed for the embodiment in FIG. 3, is applied to the die surface containing contact 440 and a conductive pedestal 470 is placed on the conductive adhesive. In this embodiment, conductive pedestal 470 is an appropriately sized slug of conductive material (e.g., copper, gold, aluminum, ceramic, metal alloy, and the like). Once the conductive pedestal is placed on the conductive adhesive, the conductive adhesive is cured, as discussed above. One advantage of the embodiment illustrated in FIG. 4 is that no burrs are created on the conductive pedestal all due to the singulation process discussed above.

Figure 5:
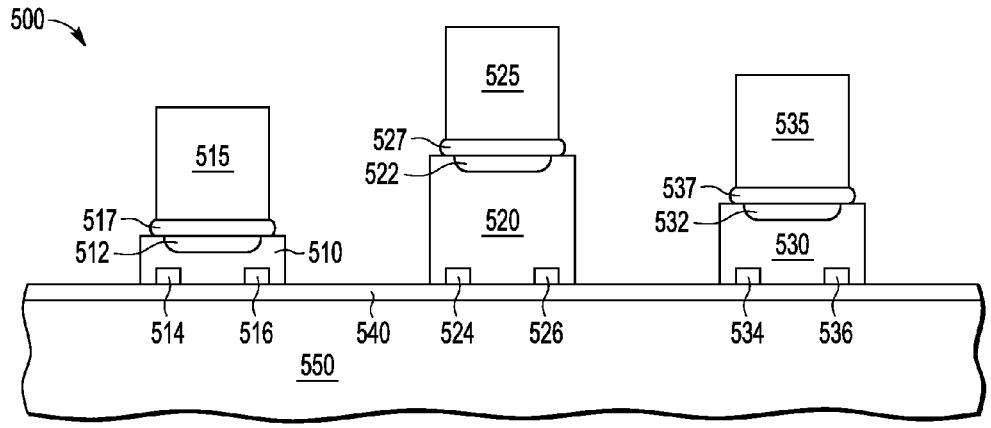
FIG. 5 is a simplified block diagram illustrating a cross sectional view of a device structure at a stage subsequent to die/conductive pedestal placement in one example of processing, according to an embodiment of the present invention.

FIG. 5 is a simplified block diagram illustrating a cross sectional view of a device structure 500 at a stage subsequent to die/conductive pedestal placement in one example of processing, according to an embodiment of the present invention. Die 510, 520, and 530 are placed active side down on an adhesive layer 540 on a carrier 550. Die 510, 520, and 530 are coupled to conductive pedestals 515, 525, and 535, respectively, using a process such as that discussed above with regard to FIGS. 2-4. That is, die 510 is affixed to conductive pedestal 515 using a conductive adhesive 517 to electrically and/or thermally couple die contact 512 with conductive pedestal 515. Similarly, die 520 is affixed to conductive pedestal 525 using conductive adhesive 527 to electrically and/or thermally couple die contact 522 with conductive pedestal 525, and die 530 is affixed to conductive pedestal 535 using conductive adhesive 537 to electrically and/or thermally couple die contact 532 with conductive pedestal 535. The "active side" of die 510, 520, and 530 is a surface of the die having bond pads 514 and 516, 524 and 526, and 534 and 536, respectively.

Adhesive layer 540 can be of a standard type used in semiconductor packaging processing including, for example, a double-sided polyimide sticky tape having a silicone adhesive on both sides. The adhesive layer should be of a type that can withstand the packaging processing without becoming brittle or permanently fixed in place, since at a later point in processing the adhesive layer will be separated from the package.

FIG. 5 illustrates die 510, 520, and 530 of varying thicknesses. FIG. 5 also illustrates conductive pedestals 515, 525, and 535 as being a same thickness. It should be noted that embodiments of the present invention are not limited to die of varying thicknesses or conductive pedestals of a same thickness for varying thickness die. However, processing flow can be simplified through the use of conductive pedestals of a same thickness for varying thickness die since decision-making and selection for die and conductive pedestals need not be performed.

Figure 6:
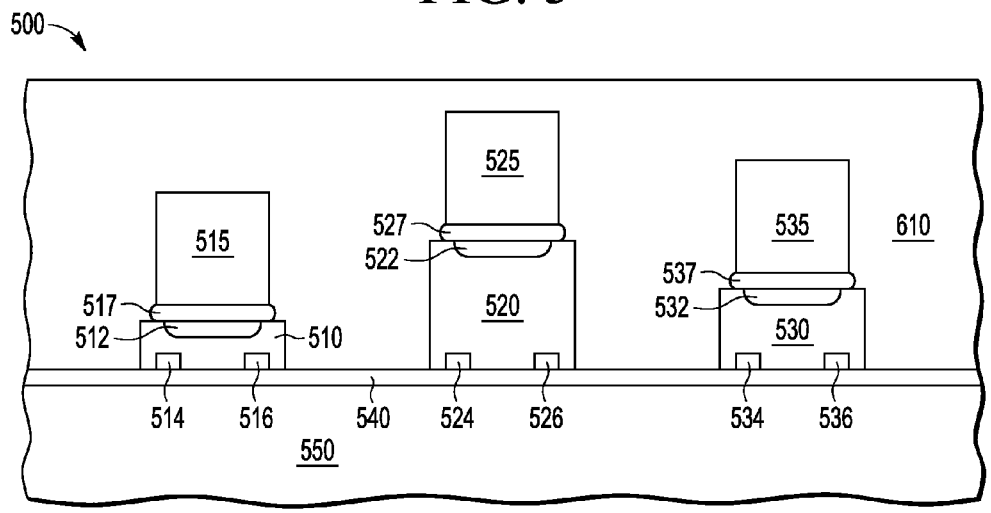
FIG. 6 is a simplified block diagram illustrating the cross-sectional view of the device structure at a later stage in the processing example.

FIG. 6 is a simplified block diagram illustrating the cross-sectional view of device structure 500 at a later stage in the processing example. A molding material is applied to the structures affixed to adhesive layer 540, forming an encapsulant 610 that encapsulates the structures within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, and spin application. Once the molding material is applied, the panel can be cured by exposing the materials to certain temperatures for a period of time, or by applying curing agents, or both. In a typical encapsulation process, a depth of encapsulant 610 will exceed a maximum height of structures embedded in the molding material (e.g., the height of the thickest die plus conductive pedestal assembly illustrated in FIG. 6).

Figure 7:
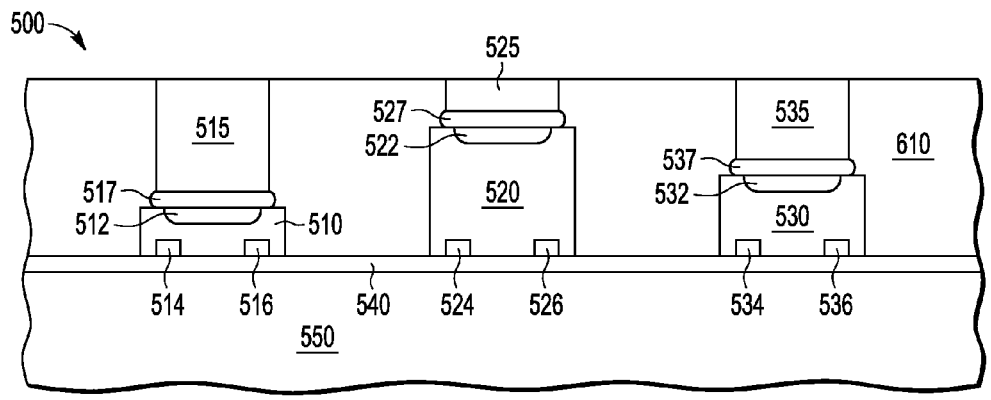
FIG. 7 is a simplified block diagram illustrating the cross sectional view of the device structure at a later stage in the processing example.

FIG. 7 is a simplified block diagram illustrating the cross sectional view of device structure 500 at a later stage in the processing example. Encapsulant 610 is reduced in thickness to expose each of conductive pedestals 515, 525, and 535. This reduction in thickness of the encapsulant and exposing of the ends of the conductive pedestals can be performed by a grinding process (e.g., back grinding or polishing). In a case involving die of varying thicknesses, as illustrated, the encapsulant thickness reduction process will be performed until a portion of the conductive pedestal attached to the thinnest of the die (e.g., die 510) is exposed. It should be appreciated that cured conductive adhesive 517, 527, and 537 has sufficient bonding strength to withstand any forces experienced at the connection between the die and the conductive pedestals due to the encapsulation reduction process.

Figure 8:
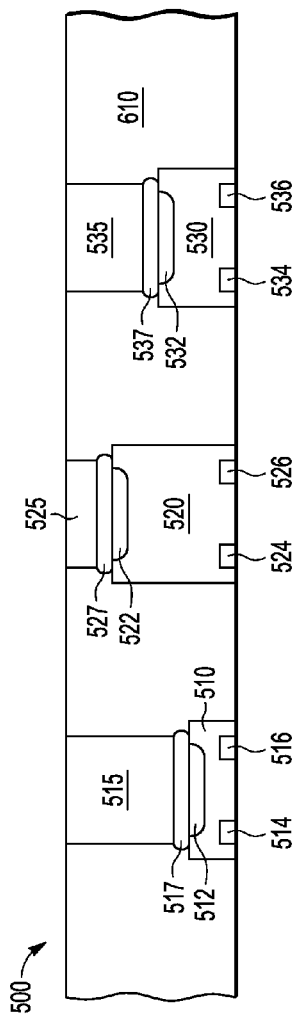
FIG. 8 is a simplified block diagram illustrating the cross sectional view of the device structure at a later stage in the processing example.

FIG. 8 is a simplified block diagram illustrating the cross sectional view of device structure 500 at a later stage in the processing example. The encapsulated panel is removed from adhesive layer 540 (and carrier 550). Once released from the adhesive layer, the side of the panel previously attached to the adhesive layer can be cleaned to remove any excess adhesive remaining attached to the encapsulated panel. This process of release and clean exposes all of the contacts on the bottom side of the panel, including bond pads 514, 516, 524, 526, 534, and 536.

Figure 9:
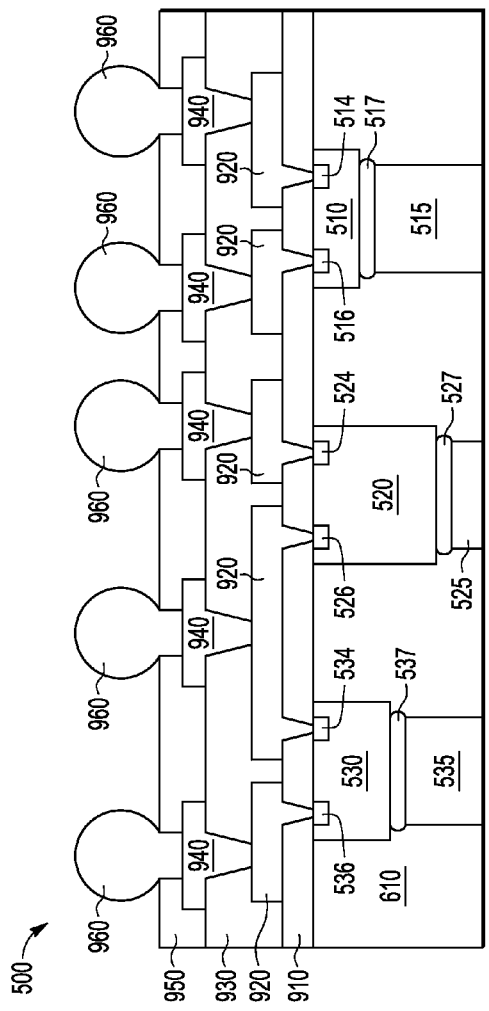
FIG. 9 is a simplified block diagram illustrating the cross sectional view of the device structure after buildup, ball placement and singulation.

FIG. 9 is a simplified block diagram illustrating a cross sectional view of device structure 500 after buildup, ball placement and singulation. Processing providing the various layers illustrated in FIG. 9 can be provided by standard techniques used in semiconductor packaging.

An insulating layer 910 can be deposited over the surface of the encapsulated die and encapsulation molding material. Insulating layer 910 can be made from organic polymers, for example, in liquid or dry form and can include a wide range of other materials used for interlayer dielectrics as known in the art (e.g., silicon dioxide, silicon nitride, silicon oxynitride, or any combination of such layers providing electrical isolation). Insulating layer 910 can be patterned to expose bonding pads 514, 516, 524, 526, 534, and 536, as well as the ends of any other conductors present in the encapsulated device (not shown).

A conductive layer 920 can then be formed to provide an interconnect between the bonding pads and other conductors, as desired for the particular application. Conductive layer 920 can include materials such as metal, metal alloy, doped semiconductor, semi-metals, or combinations thereof as known in the art (e.g., amorphous silicon, doped polysilicon, aluminum, copper, tantalum, titanium, tungsten, or any metal alloy, nitride or silicide). Through the use of a conductive layer, any number of bonding pads can be interconnected in any combination to the same or other die and to other conductors. The interconnect illustrated in FIG. 9 is provided only by way of example, and it should be realized that the interconnects formed by conductive layer 920 and other conductive layers discussed below can extend not only across the page as illustrated but also into and above the page.

An additional interconnect layer can be provided by forming additional insulating layers (e.g., insulating layer 930) and patterning those insulating layers to receive additional conductive layers (e.g., conductive layer 940). The range of materials that can be used for subsequent insulating layers and conductive layers can include those listed for insulating layer 910 and conductive layer 920, and each type of layer can be the same or different materials as required by the nature of the application. Further, as illustrated, a set of conductive ball connectors can be provided by forming insulating layer 950, patterning that layer to expose pads formed in conductive layer 940, and forming and placing conductive balls 960 using standard techniques and materials.

Figure 10:
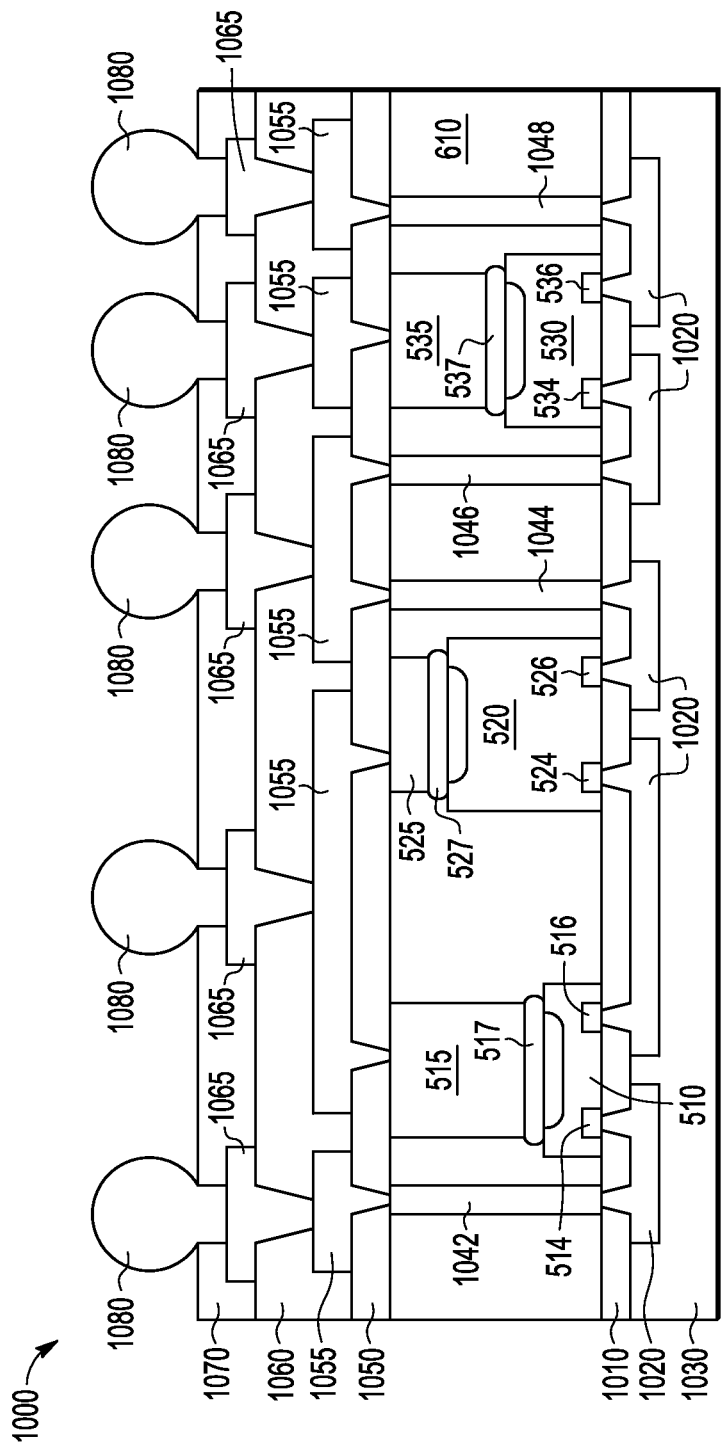
FIG. 10 is a simplified block diagram illustrating a cross sectional view of an alternative device structure after buildup, ball placement and singulation.

FIG. 10 is a simplified block diagram illustrating a cross sectional view of an alternative device structure 1000 after buildup, ball placement and singulation. Processing providing the various layers illustrated in FIG. 9 can be provided by standard techniques used in semiconductor packaging. Alternative device structure 1000 provides electrical contacts to conductive pedestals 515, 525, and 535 using an example of a backside buildup on device structure 500.

An insulating layer 1010 can be deposited over the surface exposing the active side of device die 510, 520, and 530. Insulating layer 1010 can be formed from materials contained in the listing provided for insulating layer 910, above. Insulating layer 1010 can be patterned to expose bonding pads 514, 516, 524, 526, 534, and 536, as well as the ends of any other conductors present in the encapsulated device. As shown in FIG. 10, through vias 1042, 1044, 1046, and 1048 are formed to provide an electrical conduit between the major surfaces of device structure 500. Insulating layer 1010 is also patterned to expose ends of the through vias.

A conductive layer 1020 can then be formed to provide an interconnect between bonding pads and through vias and other conductors, as desired for a particular application. Conductive layer 1020 can be formed from materials provided in the list for conductive layer 920, above. The interconnect illustrated in FIG. 10 is provided only by way of example, and it should be realized that the interconnects formed by conductive layer 1020 and other conductive layers discussed in relation to FIG. 10 can extend not only across the page as illustrated but also into and above the page.

An additional insulating layer 1030 is also formed on conductive layer 1020 and any exposed insulating layer 1010. In some embodiments, an external connection can be provided along this surface of device structure 1000, similar to the connectors provided in FIG. 9. As illustrated, however, external connectors are provided along the opposite major surface through a backside buildup of the device structure.

An insulating layer 1050 is formed on the major surface at which conductive pedestals 515, 525, and 535 are exposed. The range of materials used for insulating layer 1050, and for subsequent insulating layers discussed with regard to FIG. 10, can include those listed for insulating layer 910, and each type of layer can be the same or different materials as required by the nature of the application.

Interconnect layers can be provided by forming one or more conductive layers (e.g., 1055 and 1065) and additional insulating layers (e.g., 1060 and 1070). Insulating layer 1050 is patterned to expose a portion of the conductive pedestals and ends of through vias 1042, 1044, 1046, and 1048. Further, as illustrated, a set of conductive ball connectors can be provided by forming insulating layer 1070, patterning that layer to expose pads formed in conductive layer 1065, and forming and placing conductive balls 1080 using standard techniques and materials.

Embodiments of the present invention are not limited to the particular type of process, devised structures, and conductors illustrated in the figures. For example, additional die that don't have attached pedestals can be included in a packaged device assembly along with those that do have attached pedestals. Also, conductive vias can also be included to provide additional signal paths from an interconnect as illustrated in FIG. 9 to the other encapsulated device assembly major surface. It should be realized, however, that steps discussed above may require modification for different types of processes or additional features.

The die and conductive pedestal assemblies of the present invention allow for pre-encapsulation assembly of a backside conductor for a packaged device die. Die and conductive pedestal assemblies can be formed in a manner that allows for them to be dropped into place during a pick and place process, at the same time as other components in the package device assembly. This allows for simplified incorporation of devices having backside conductors in package device assemblies, and avoids time-consuming and process intensive post-encapsulation exposure of backside connectors. Embodiments of the present invention further allow for use of die with varying thicknesses having backside conductors in the same package.

The processes of the present invention save the need for post-encapsulation drilling and filling steps. Incorporation of the conductive pedestals provides consistent quality thermal and electrical paths through the depth of the package that do not depend upon a quality of a fill operation.

By now it should be appreciated that there has been provided, in one embodiment, a method for packaging an electronic device assembly that includes coupling a conductive pedestal to a die contact of an electronic device die to form a first die-pedestal assembly, placing the first die-pedestal assembly in a first area for the electronic device assembly, forming an encapsulant over and around sides of the first die-pedestal assembly, and exposing a free major surface of the conductive pedestal. The conductive pedestal includes a major surface coupled to the die contact and a second major surface opposite the first major surface, which is the free major surface. An area of the first major surface is less than an area of the electronic device die major surface that includes the die contact.

In one aspect of the above embodiment, the conductive pedestal can include one or more of copper, nickel, gold, aluminum, ceramic, and a metal alloy. In another aspect of the above embodiment, the coupling of the conductive pedestal to the die contact includes applying a conductive adhesive to one or more of the first major surface of the conductive pedestal or the die contact major surface of the electronic device die, placing the other of the conductive pedestal or the die contact major surface of the die in contact with the conductive adhesive, and performing a curing operation to set the conductive adhesive. In a further aspect, the conductive adhesive includes solder and the curing operation is a solder reflow. In another further aspect, the conductive adhesive includes conductive epoxy and the curing operation includes heating the region that includes the conductive epoxy.

In another aspect of the above embodiment, the coupling includes holding a lead frame on a carrier where the lead frame includes the conductive pedestal and a plurality of conductive pedestals coupled to one another by spars, applying a conductive adhesive to the first major surface of the conductive pedestal, placing the electronic device die on the conductive adhesive where the die contact is in contact with the conductive adhesive. A further aspect includes separating the conductive pedestal from the plurality of conductive pedestals by cutting the spars, performing that cutting such that any burrs from remaining spar material are retained within an area defined by the electronic device die.

In another aspect, the coupling includes holding the electronic device die such that the die contact is accessible, applying a conductive adhesive to the electronic device die surface comprising the die contact, and placing the conductive pedestal on the conductive adhesive such that the conductive pedestal is one or more of directly in contact with the die contactor or in electrical or thermal contact with the die contact by virtue of the conductive adhesive. In still another aspect, the coupling provides one or more of an electronic coupling or a thermal coupling.

Another aspect further includes coupling a heat sink to the second major surface of the pedestal, wherein coupling the heat sink is performed subsequent to the exposing, and the die contact is a thermal contact. Still another aspect further includes coupling a second electronic device contact to the second major surface of the conductive pedestal, where coupling the second electronic device contact is performed subsequent to the exposing, and the die contact is an electronic contact.

Still another aspect includes placing second die-pedestal assembly in a second area for the electronic device assembly where a combined thickness of the second die-pedestal assembly is not the same as a combined thickness of the first die-pedestal assembly and the encapsulant is further formed over and around sides of the second die-pedestal assembly, and performing the exposing to expose both the free major surface of the conductive pedestal and a conductive pedestal of the second die-pedestal assembly. In a further aspect, performing the exposing includes performing a back grind operation to a depth sufficient to expose the free surface of the shortest of the conductive pedestals of the first and second die-pedestal assemblies.

Another embodiment of the present invention provides a packaged electronic device assembly that includes: a die that includes a first major surface having a die contact and a second major surface having one or more electronic contacts; a conductive pedestal coupled to the die contact at a major surface of the conductive pedestal where the major surface of the conductive pedestal has an area that is less than an area of the first major surface of the die; and, encapsulant over and around the die and the conductive pedestal forming the packaged electronic assembly. A free surface of the conductive pedestal is exposed. The one or more electronic contacts are exposed at an opposite major surface of the packaged electronic device assembly from the exposed conductive pedestal. The free surface of the conductive pedestal is opposite to the major surface of the conductive pedestal.

One aspect of the above embodiment further includes a conductive adhesive coupling the die contact to the conductive pedestal, where the conductive adhesive is one or more of thermally conductive and electrically conductive. In a further aspect, the conductive adhesive includes one of solder or conductive epoxy.

In another aspect of the above embodiment, the conductive pedestal is one or more of copper, nickel, gold, aluminum, ceramic, or a metal alloy. Another aspect of the above embodiment includes a heat sink coupled to the free surface of the conductive pedestal where the die contact is a thermal contact. Still another aspect of the above embodiment includes a second electronic device contact coupled to the free surface of the conductive pedestal where the die contact is an electronic contact.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method for packaging an electronic device assembly, the method comprising:
    coupling a conductive pedestal to a die contact of an electronic device die to form a first die-pedestal assembly, wherein
        the conductive pedestal comprises a first major surface coupled to the die contact and a second major surface opposite the first major surface, and
        an area of the first major surface is less than an area of the electronic device die major surface comprising the die contact,
        said coupling comprises holding a lead frame on a carrier wherein the lead frame comprises a plurality of conductive pedestals coupled to one another by one or more spars and the plurality of conductive pedestals comprises the conductive pedestal, applying a conductive adhesive to the first major surface of the conductive pedestal, and placing the electronic device die on the conductive adhesive wherein the die contact is in contact with the conductive adhesive;
    placing the first die-pedestal assembly in a first area for the electronic device assembly;
    forming an encapsulant over and around sides of the first die-pedestal assembly; and
    exposing the second major surface of the conductive pedestal.

2. The method of claim 1 wherein the conductive pedestal comprises one or more of copper, nickel, gold, aluminum, ceramic, and a metal alloy.

3. The method of claim 1 wherein said coupling further comprises:
    performing a curing operation to set the conductive adhesive.

4. The method of claim 3 wherein the conductive adhesive comprises solder and the curing operation comprises a solder reflow.

5. The method of claim 3 wherein the conductive adhesive comprises conductive epoxy and the curing operation comprises heating the region comprising the conductive epoxy.

6. The method of claim 1 further comprising:
    separating the conductive pedestal from the plurality of conductive pedestals by cutting the spars, wherein said cutting is performed such that any burrs from remaining spar material are retained within an area defined by the electronic device die.

7. The method of claim 1 wherein said coupling comprises:
    holding the electronic device die such that the die contact is accessible;
    applying a conductive adhesive to the electronic device die surface comprising the die contact;
    placing the conductive pedestal on the conductive adhesive such that the conductive pedestal is one or more of directly in contact with the die contact or in electrical or thermal contact with the die contact by virtue of the conductive adhesive.

8. The method of claim 1 wherein said coupling provides one or more of an electronic coupling or a thermal coupling.

9. The method of claim 1 further comprising:
    coupling a heat sink to the second major surface of the pedestal, wherein
        said coupling the heat sink is performed subsequent to said exposing, and
        the die contact is a thermal contact.

10. The method of claim 1 further comprising:
coupling a second electronic device contact to the second major surface of the conductive pedestal, wherein
said coupling the second electronic device contact is performed subsequent to said exposing, and
the die contact is an electronic contact.

11. The method of claim 1 further comprising:
placing a second die-pedestal assembly in a second area for the electronic device assembly, wherein
a combined thickness of the second die-pedestal assembly is not the same as a combined thickness of the first die-pedestal assembly,
the encapsulant is further formed over and around sides of the second die-pedestal assembly; and
performing said exposing to expose both the free major surface of the conductive pedestal and a conductive pedestal of the second die-pedestal assembly.

12. The method of claim 11 wherein said performing said exposing comprises:
performing a back grind operation to a depth sufficient to expose the free surface of the shortest of the conductive pedestals of the first and second die-pedestal assemblies.

* * * * *